(12) United States Patent
Han et al.

(10) Patent No.: US 10,770,403 B2
(45) Date of Patent: Sep. 8, 2020

(54) FAN-OUT SEMICONDUCTOR PACKAGE

(71) Applicant: SAMSUNG ELECTRONICS CO., LTD., Suwon-si (KR)

(72) Inventors: Mi Ja Han, Suwon-si (KR); Han Kim, Suwon-si (KR); Seong Chan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 16/197,764

(22) Filed: Nov. 21, 2018

(65) Prior Publication Data
US 2019/0341355 A1 Nov. 7, 2019

(30) Foreign Application Priority Data

May 4, 2018 (KR) .................. 10-2018-0051915

(51) Int. Cl.
*H01L 23/552* (2006.01)
*H01L 23/31* (2006.01)
(Continued)

(52) U.S. Cl.
CPC ........ *H01L 23/552* (2013.01); *H01L 23/3107* (2013.01); *H01L 23/5383* (2013.01);
(Continued)

(58) Field of Classification Search
CPC ............. H01L 23/3121; H01L 23/3135; H01L 23/481; H01L 23/49838; H01L 23/5225; H01L 23/5389; H01L 23/3107; H01L 23/5226; H01L 23/3114; H01L 23/585; H01L 23/5227; H01L 24/83; H01L 2224/0346; H01L 23/538; H01L 2224/11462; H01L 23/49562;
(Continued)

(56) References Cited

U.S. PATENT DOCUMENTS 8,492,196 B2 7/2013 Pagaila et al.
2005/0184405 A1 8/2005 Bai et al.
(Continued)

FOREIGN PATENT DOCUMENTS

CN 102348641 A 2/2012
KR 10-2008-0005005 A 1/2008
(Continued)

OTHER PUBLICATIONS

Communication dated May 9, 2019 by the Korean Intellectual Property Office in counterpart Korean Patent Application No. 10-2018-0051915.
(Continued)

*Primary Examiner* — Theresa T Doan
(74) *Attorney, Agent, or Firm* — Sughrue Mion, PLLC

(57) ABSTRACT

A fan-out semiconductor package includes a connection member including an insulating layer and a redistribution layer, a semiconductor chip disposed on the connection member, an encapsulant encapsulating the semiconductor chip, and an electromagnetic radiation blocking layer disposed above the semiconductor chip and including a base layer in which a plurality of degassing holes are formed and a porous blocking portion filled in the plurality of degassing holes.

16 Claims, 12 Drawing Sheets

(51) Int. Cl.
*H01L 23/538* (2006.01)
*H01L 23/00* (2006.01)

(52) U.S. Cl.
CPC ...... *H01L 23/5386* (2013.01); *H01L 23/5389* (2013.01); *H01L 24/20* (2013.01); *H01L 2224/214* (2013.01); *H01L 2924/19105* (2013.01); *H01L 2924/3025* (2013.01)

(58) Field of Classification Search
CPC ... H01L 23/49833; H01L 24/33; H01L 23/28; H01L 23/48
USPC .......................................................... 257/659
See application file for complete search history.

(56) References Cited

U.S. PATENT DOCUMENTS

| | | |
|---|---|---|
| 2007/0278632 A1 | 12/2007 | Zhao et al. |
| 2011/0318249 A1 | 12/2011 | Nakayama et al. |
| 2016/0336249 A1 | 11/2016 | Kang et al. |
| 2017/0287853 A1 | 10/2017 | Kim et al. |
| 2017/0373035 A1 | 12/2017 | Seol et al. |
| 2018/0047683 A1 | 2/2018 | Lee et al. |
| 2018/0076156 A1 | 3/2018 | Kim et al. |
| 2018/0096927 A1 | 4/2018 | Kim et al. |
| 2018/0366426 A1 | 12/2018 | Lee et al. |
| 2019/0341353 A1* | 11/2019 | Han ...................... H01L 23/552 |

FOREIGN PATENT DOCUMENTS

| | | |
|---|---|---|
| KR | 10-2015-0113660 A | 10/2015 |
| KR | 10-2016-0132749 A | 11/2016 |
| KR | 10-2018-0000655 A | 1/2018 |
| KR | 10-2018-0018232 A | 2/2018 |
| KR | 10-2018-0029398 A | 3/2018 |
| TW | 200818422 A | 4/2008 |
| TW | 201735295 A | 10/2017 |
| TW | 201801268 A | 1/2018 |
| TW | 201814861 A | 4/2018 |

OTHER PUBLICATIONS

Communication dated Nov. 27, 2019, issued by the Taiwanese Patent Office in counterpart Taiwanese Application No. 107140792.

* cited by examiner

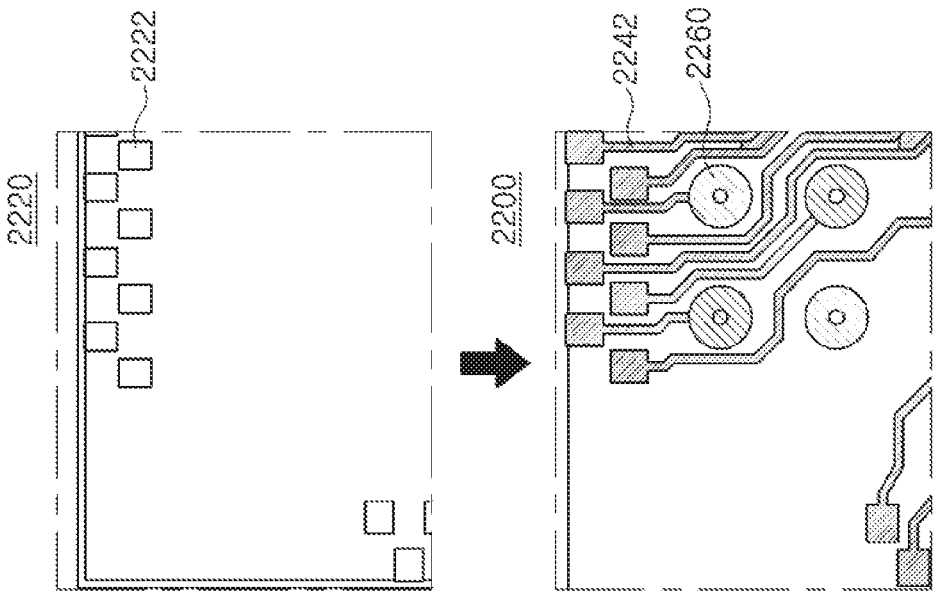
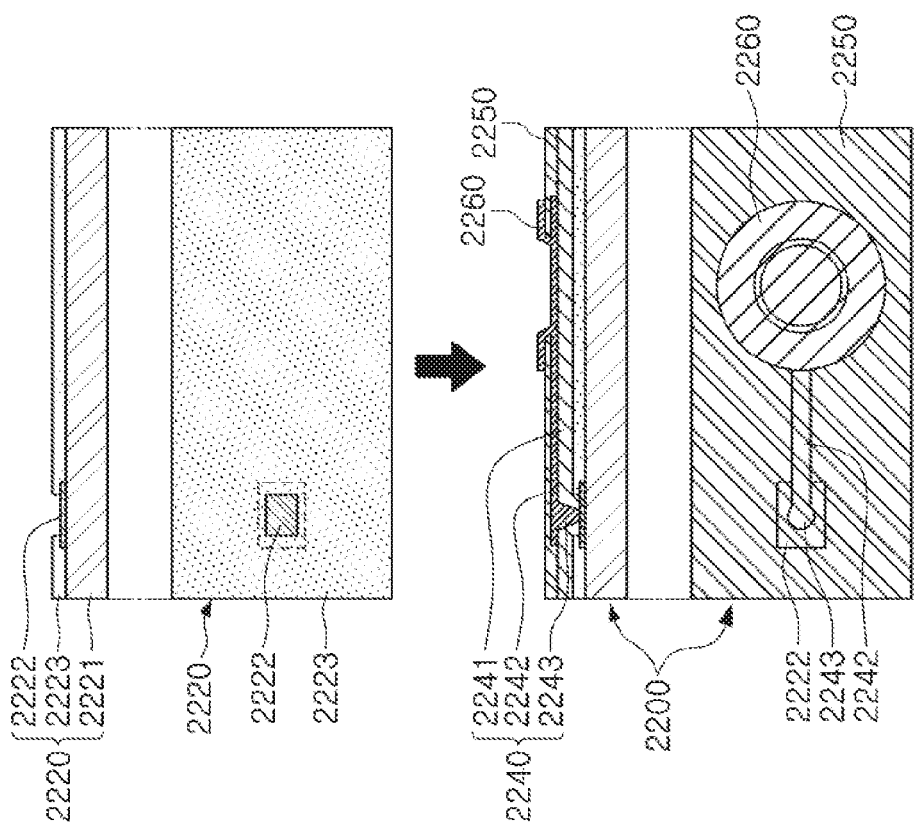
FIG. 3B
FIG. 3A

FAN-OUT SEMICONDUCTOR PACKAGE

CROSS-REFERENCE TO RELATED APPLICATION(S)

This application claims the benefit of priority to Korean Patent Application No. 10-2018-0051915 filed on May 4, 2018, in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size, while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing connection terminals outwardly of a region in which a semiconductor chip is disposed.

In the semiconductor package, when electromagnetic radiation has an influence on the semiconductor chip, and the like, a problem may occur. Therefore, an effective electromagnetic radiation blocking structure is required in the semiconductor package.

SUMMARY

An aspect of the present disclosure may provide a fan-out semiconductor package in which electromagnetic radiation blocking efficiency may be high and a gas that may be generated in a product may be effectively removed.

According to an aspect of the present disclosure, a fan-out semiconductor package may include a connection member including an insulating layer and a redistribution layer, a semiconductor chip disposed on the connection member, an encapsulant encapsulating the semiconductor chip, and an electromagnetic radiation blocking layer disposed above the semiconductor chip and including a base layer in which a plurality of degassing holes are formed and a porous blocking portion filled in the plurality of degassing holes.

The porous blocking portion may have a form in which a plurality of particles are agglomerated.

The porous blocking portion may be a porous plating layer.

The base layer may have metal thin film form.

The base layer may be a Cu plating layer.

The electromagnetic radiation blocking layer may include a first region and a second region, and a density of the degassing holes may be higher in the first region than in the second region.

The second region may be disposed in a region corresponding to the semiconductor chip.

The fan-out semiconductor package may further include a core member including a through-hole in which the semiconductor chip is accommodated and a metal layer covering walls forming the through-hole.

The metal layer of the core member and the electromagnetic radiation blocking layer may be connected to each other through a conductive via penetrating through the encapsulant.

The fan-out semiconductor package may further include a plurality of passive components disposed on the connection member.

The first region may be disposed in a region corresponding to at least some of the plurality of passive components.

Distances from upper surfaces of at least some of the plurality of passive components to an upper surface of the encapsulant may be different from each other, and a density of the degassing holes may be higher in a region corresponding to a passive component having a greater distance from an upper surface thereof to the upper surface of the encapsulant is greater among the plurality of passive components.

The plurality of passive components may include a capacitor and an inductor, and a density of the degassing holes may be higher in a region corresponding to the capacitor than in a region corresponding to the inductor.

According to another aspect of the present disclosure, a fan-out semiconductor package may include: a connection member including an insulating layer and a redistribution layer, a semiconductor chip disposed on the connection member, an encapsulant encapsulating the semiconductor chip, and an electromagnetic radiation blocking layer disposed above the semiconductor chip and having a porous structure.

The electromagnetic radiation blocking layer may have a form in which a plurality of particles are agglomerated.

The electromagnetic radiation blocking layer may be a porous plating layer.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
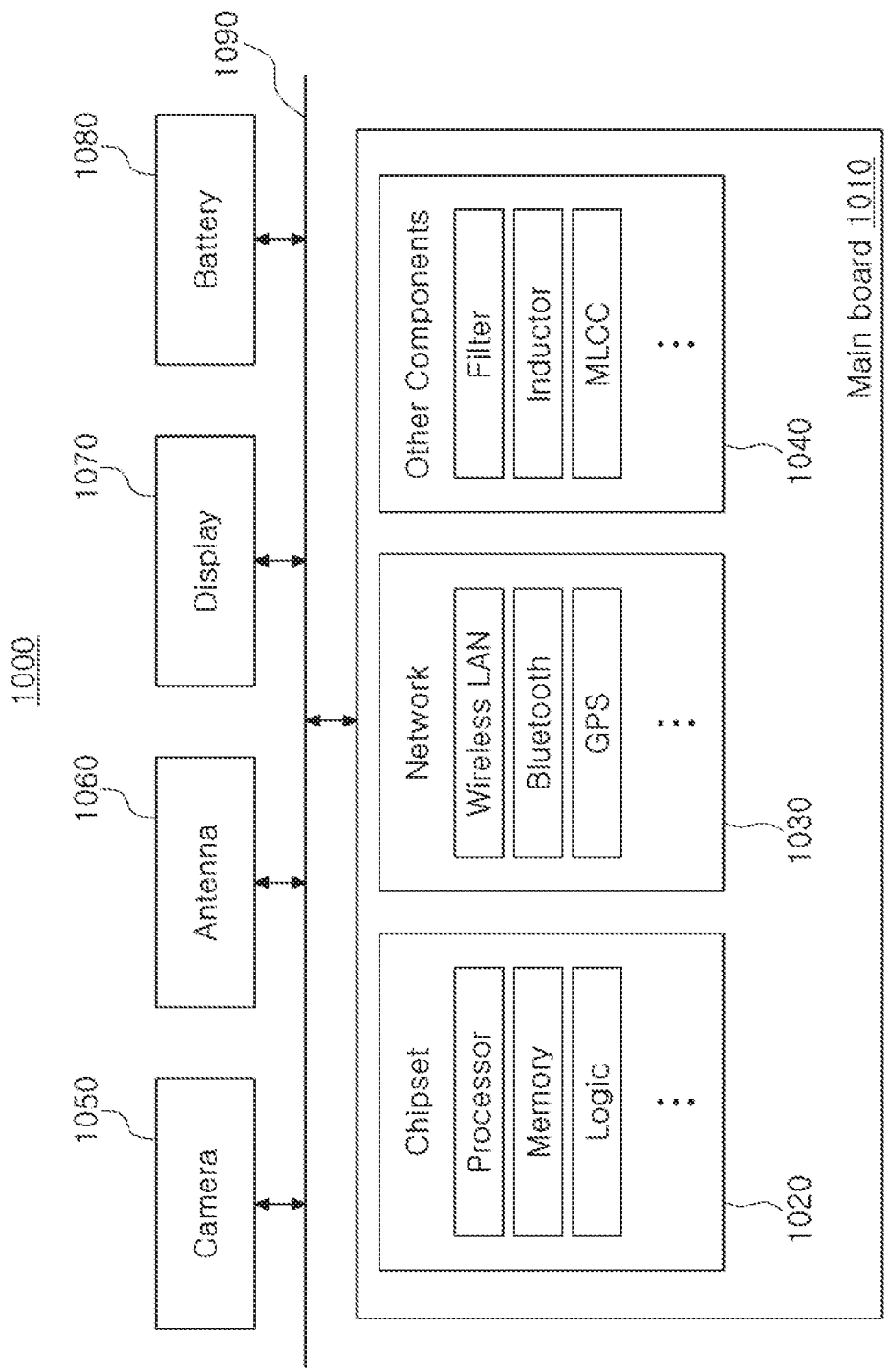
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
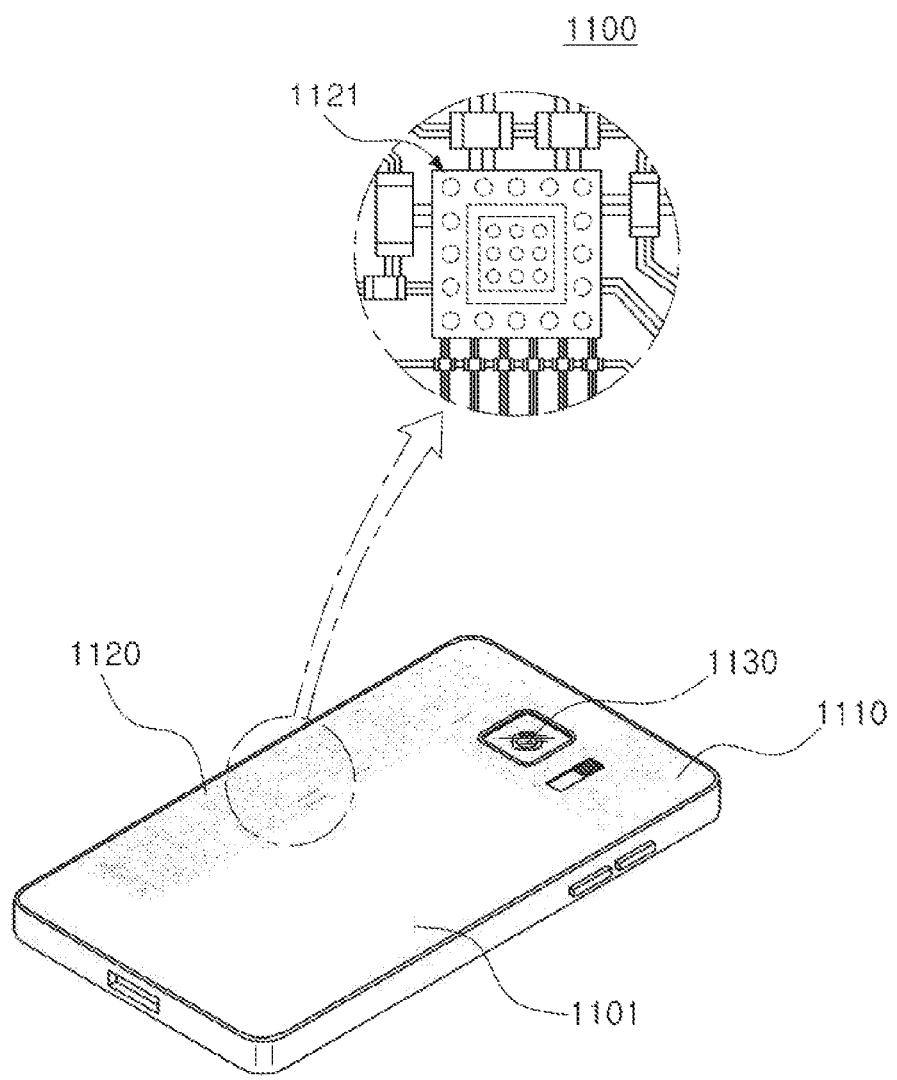
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
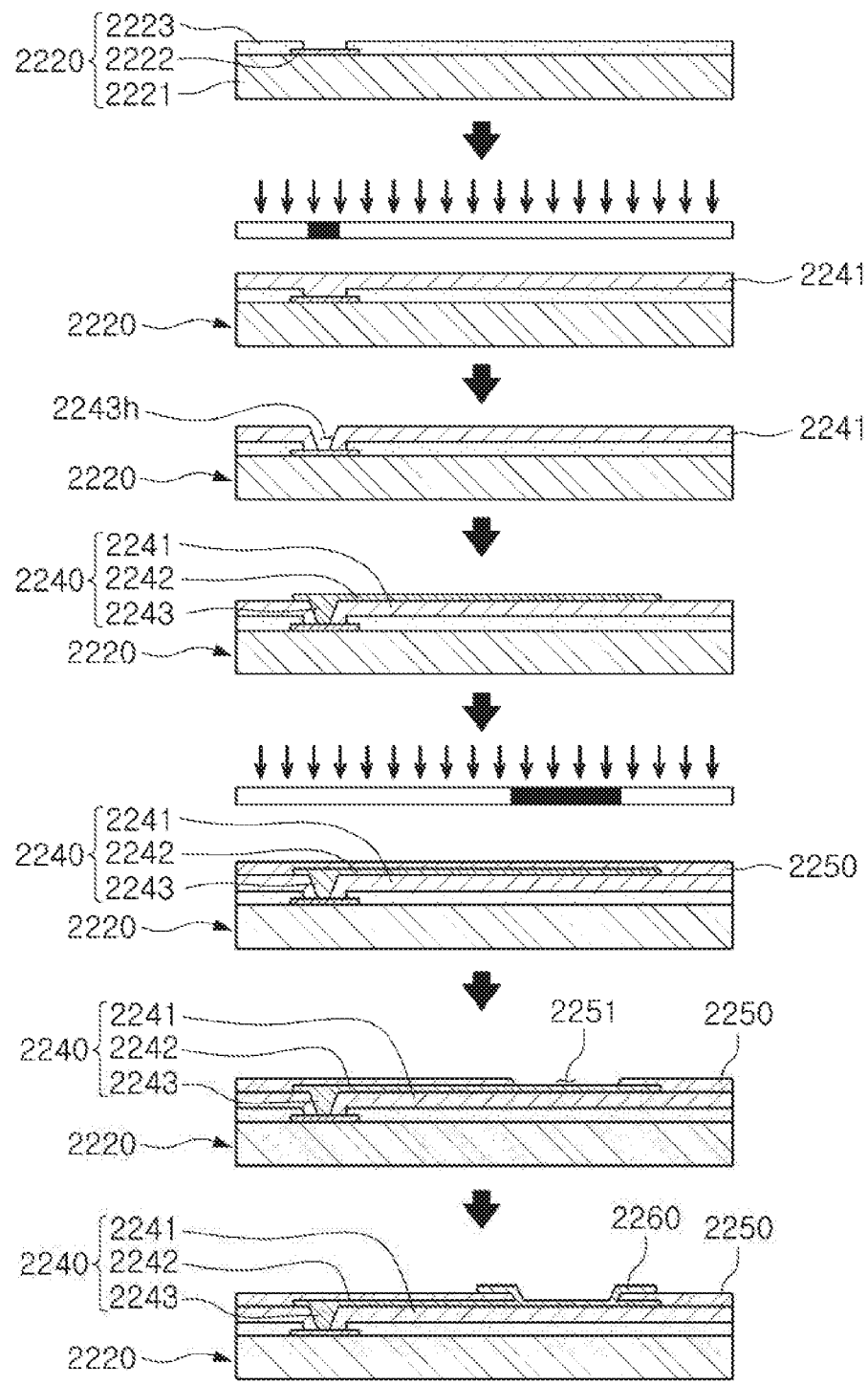
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
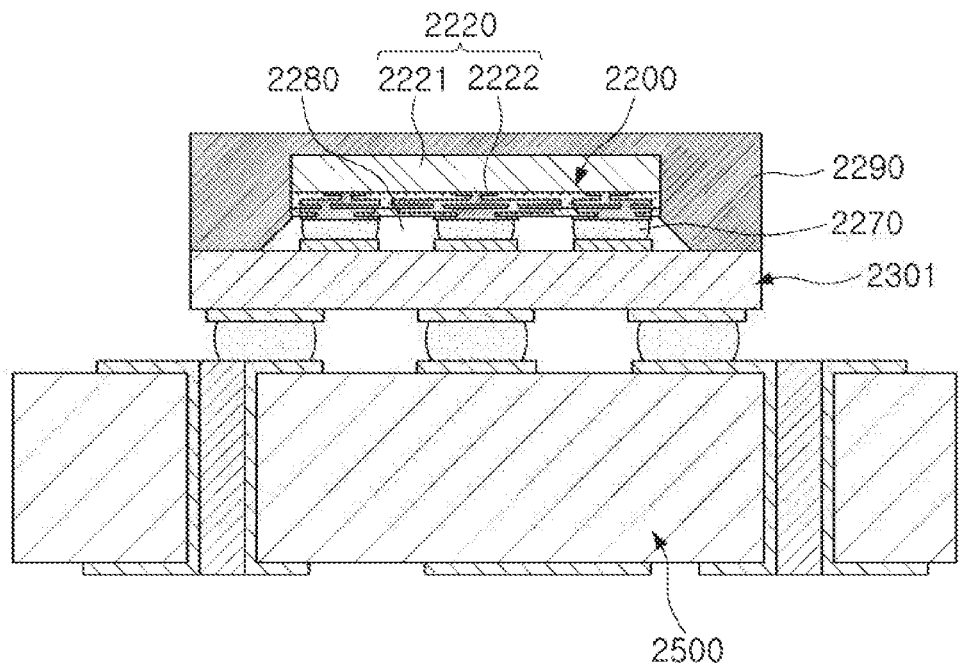
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
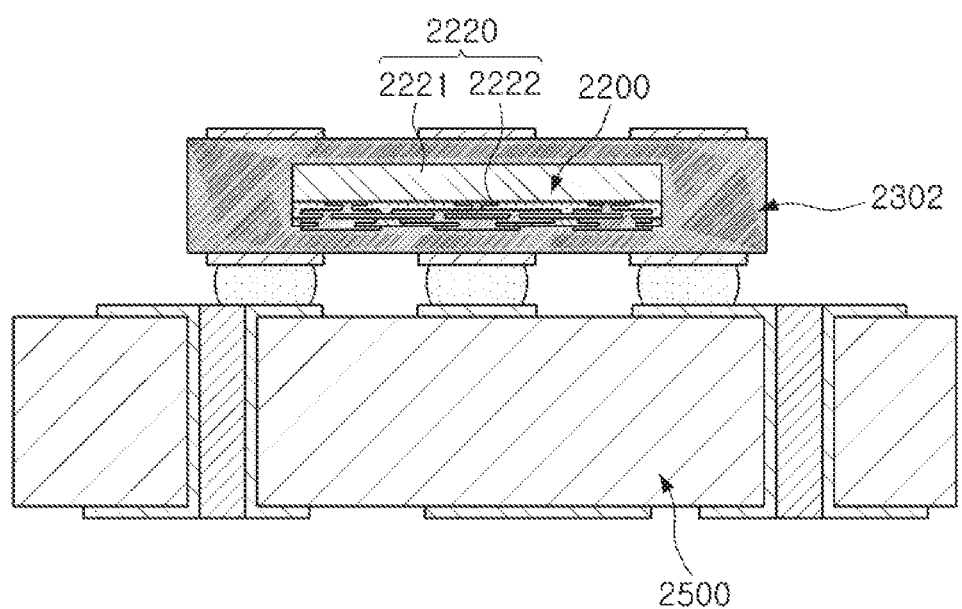
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard

2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
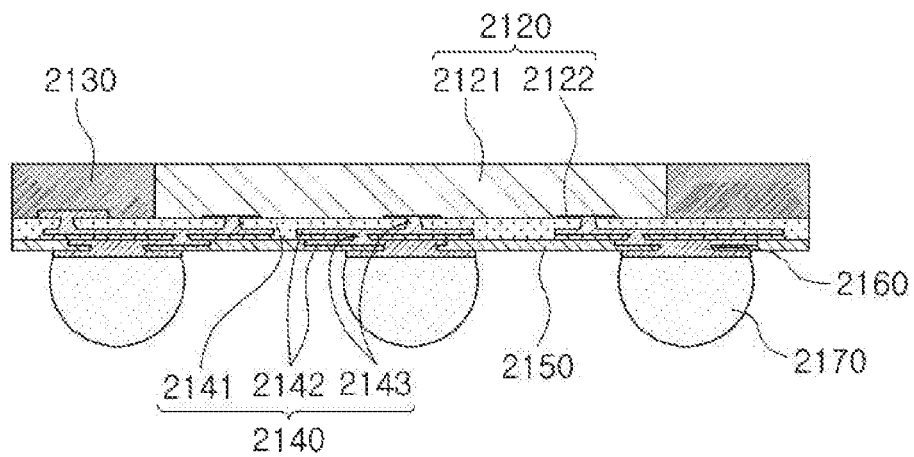
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
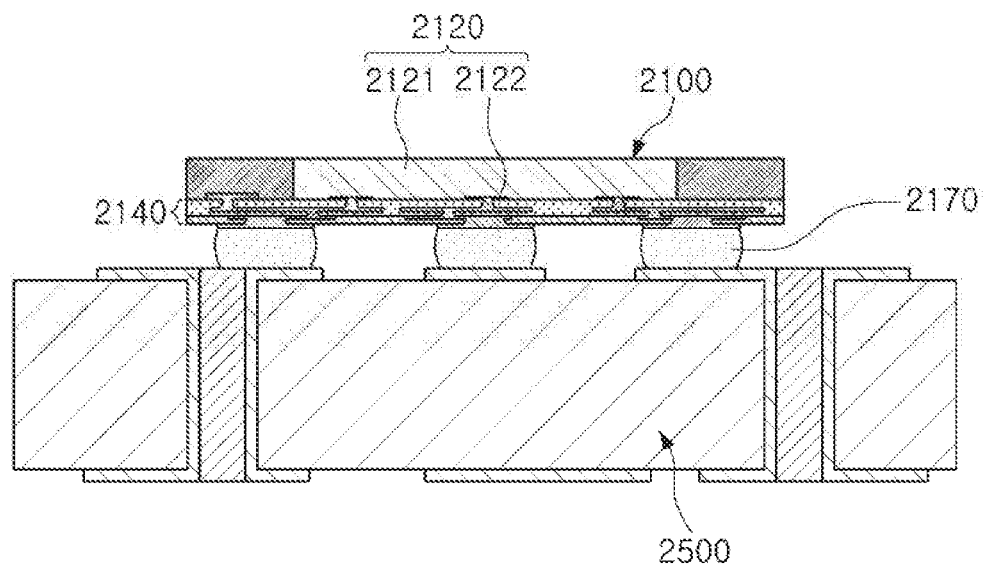
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Fan-out semiconductor packages according to exemplary embodiments in the present disclosure will hereinafter be described with reference to the drawings.

Figure 9:
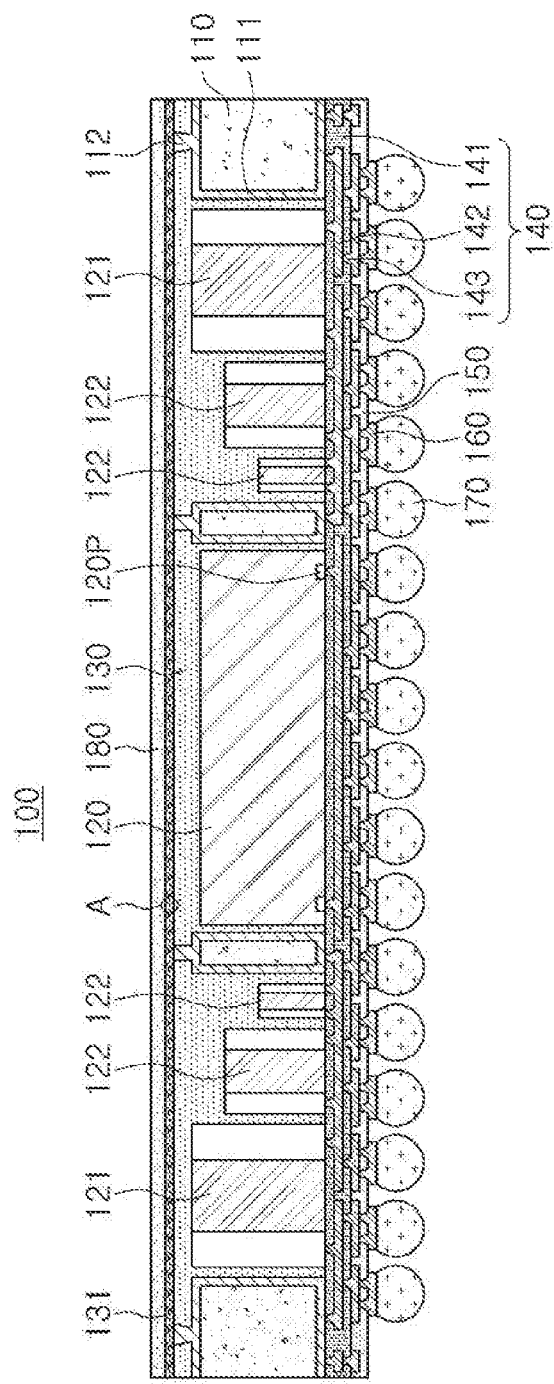
FIGS. 9 and 10 are, respectively, a schematic cross-sectional view and a schematic plan view illustrating a fan-out semiconductor package according to an exemplary embodiment in the present disclosure.
Figure 10:
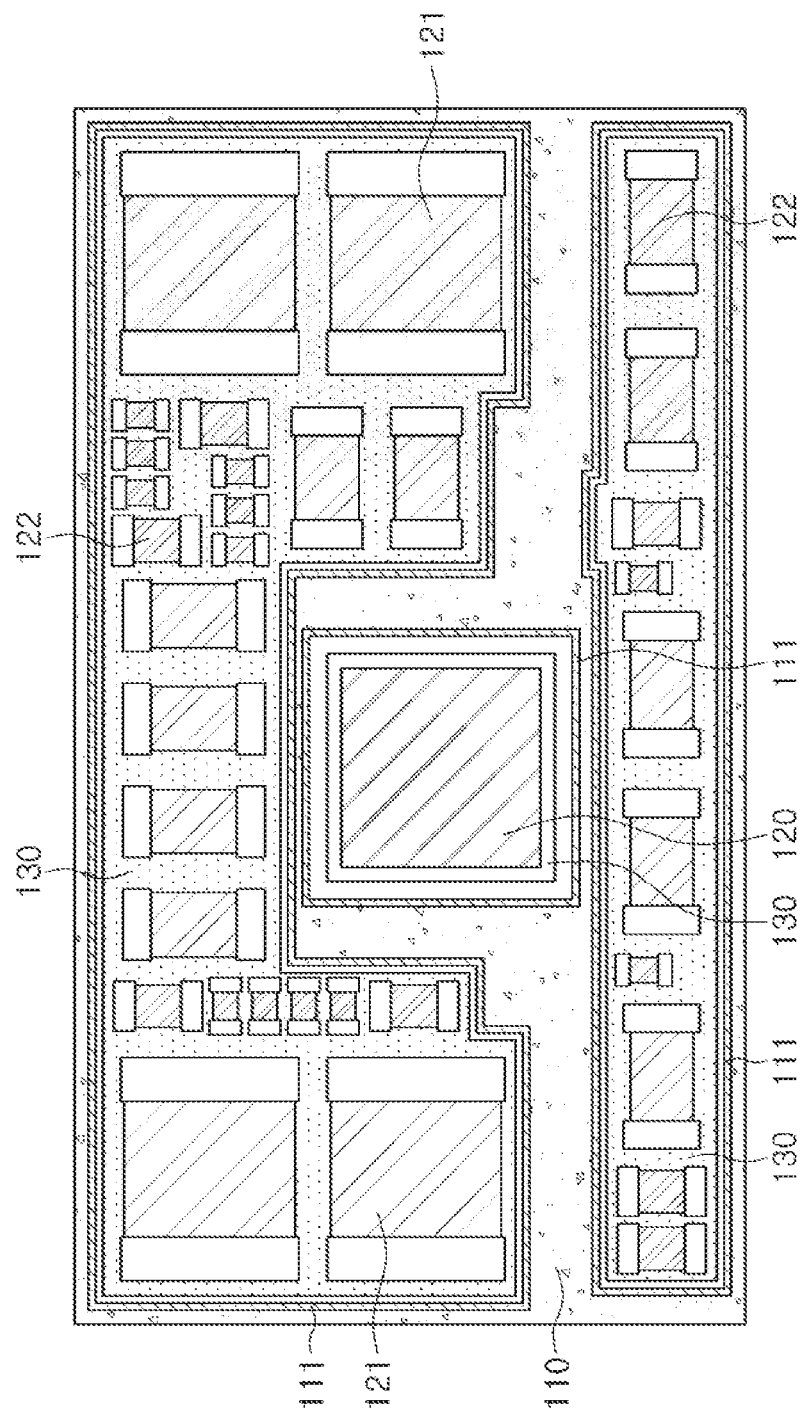
Figure 11:
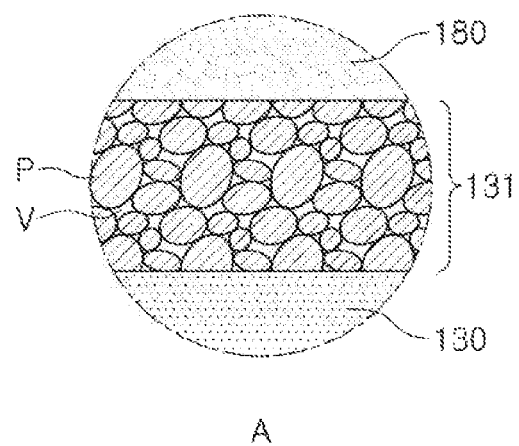
FIG. 11 is a view illustrating a form of an electromagnetic radiation blocking layer that may be used in an exemplary embodiment of FIGS. 9 and 10.

FIGS. 9 and 10 are, respectively, a schematic cross-sectional view and a schematic plan view illustrating a fan-out semiconductor package according to an exemplary embodiment in the present disclosure. FIG. 11 is a view illustrating a form of an electromagnetic radiation blocking layer that may be used in an exemplary embodiment of FIGS. 9 and 10.

First, referring to FIGS. 9 and 10, the fan-out semiconductor package 100 according to the exemplary embodiment may include a semiconductor chip 120, an encapsulant 130, a connection member 140, and an electromagnetic radiation blocking layer 131. The electromagnetic radiation blocking layer 131 may have a porous structure to provide a gas discharge path. In addition, the fan-out semiconductor package 100 may include a core member 110, additional passive components 121 and 122, passivation layers 150 and 180, underbump metal layers 160, electrical connection structures 170, and the like.

The connection member 140 may redistribute connection pads 120P of the semiconductor chip 120. In addition, when the passive components 121 and 122 are provided, the connection member 140 may electrically connect the semiconductor chip 120 and the passive components 121 and 122 to each other. In order to implement such a function, the connection member 140 may include insulating layers 141, redistribution layers 142 disposed on the insulating layers 141, and vias 143 penetrating through the insulating layers 141 and connecting the redistribution layers 142 to each other. The connection member 140 may be formed of a single layer, or may be formed of a plurality of layers of which the number is more than that illustrated in the drawings.

A material constituting the insulating layer 141 may be, for example, a photosensitive insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to redistribute the connection pads 120P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground patterns, power patterns, signal patterns, and the like. Here, the signal patterns may include various signals except for the ground patterns, the power patterns, and the like, such as data signals, and the like. In addition, the redistribution layers 142 may include via pads, connection terminal pads, and the like.

The vias 143 may electrically connect the redistribution layers 142, the connection pads 120P, or the like, formed on different layers to each other, resulting in an electrical connection path in the fan-out semiconductor package 100. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have any shape known in the related art, such as a tapered shape, a cylindrical shape, and the like.

The semiconductor chip 120 may be disposed on the connection member 140 and may be an integrated circuit (IC). The semiconductor chip 120 may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto.

The semiconductor chip 120 may be formed on the basis of an active wafer. In this case, a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer exposing the connection pads 120P may be formed on the body, and may be an oxide layer, a nitride layer, or the like, or a double layer of an oxide layer and a nitride layer. An insulating layer, and the like, may also be further disposed in required positions. The semiconductor chip 120 may be a bare die, but may further include a redistribution layer formed on an active surface thereof, if necessary.

In addition to the semiconductor chip 120, the passive components 121 and 122 may be disposed on the connection member 140, and an example of the passive components 121 and 122 may include an inductor 121, a capacitor 122, and the like. In this case, some of the passive components 121 and 122 may have different sizes. For example, the inductor 121 may have a size larger than that of the capacitor 122. In addition to such a difference in the size, the necessity to block an electromagnetic radiation is greater in the inductor 121 than in the capacitor 122 due to characteristics of the components. Therefore, in the present exemplary embodiment, the electromagnetic radiation blocking layer 131 is designed to be appropriate for the inductor 121, and related contents will be described below. Meanwhile, the passive components 121 and 122 may include a resistor element, in addition to the inductor 121 and the capacitor 122.

The encapsulant 130 may encapsulate the semiconductor chip 120, the passive components 121 and 122, and the like. The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as Ajinomoto Buildup Film (ABF), FR-4, Bismaleimide Triazine (BT), or the like. In addition, any known molding material such as an epoxy molding compound (EMC), or the like, may be used, and a photoimagable encapsulant (PIE) may be used, if necessary. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material.

The core member 110 may be disposed on the connection member 140, and may have a through-hole in which the semiconductor chip 120, and the like, are accommodated. In this case, a plurality of through-holes may be provided in the core member 110. The core member 110 may further improve rigidity of the fan-out semiconductor package 100, and serve to secure uniformity of a thickness of the encapsulant 130. A material of the core member 110 is not particularly limited. For example, an insulating material may be used as the material of the core member 110. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The core member 110 may include a metal layer 111 covering walls forming the through-hole. The metal layer 111 may effectively block electromagnetic radiations emitted from the semiconductor chip 120 and the passive components 121 and 122. As in a form illustrated in the drawings, the metal layer 111 may extend to an upper surface and a lower surface of the core member 110, and may be connected to the electromagnetic radiation blocking layer 131 by conductive vias 112 penetrating through the encapsulant 130.

The electromagnetic radiation blocking layer 131 may be disposed above the semiconductor chip 120, or the like, and may have the porous structure. The electromagnetic radiation blocking layer 131 may include a material effective to perform an electromagnetic radiation blocking function, for example, a metal component such as Cu, Ag, Ti, or the like. When an electromagnetic radiation blocking effect is enhanced by disposing the metal layer 111 and the electromagnetic radiation blocking layer 131 in the vicinity of the semiconductor chip 120, and the like, it may be difficult for a gas generated in the encapsulant 130, or the like, to be externally discharged. In the present exemplary embodiment, the electromagnetic radiation blocking layer 131 may be formed in the porous structure to effectively discharge the gas. As in a form illustrated in FIG. 11, the electromagnetic radiation blocking layer 131 may have a form in which a plurality of particles P are agglomerated, voids V may be formed between the particles P, and the gas may enter or exit through the voids. The porous structure of the electromagnetic radiation blocking layer 131 may be implemented by controlling sizes, an amount, and the like, of the particles so that the plurality of particles form an agglomerate, and binders may be interposed between the particles P, if necessary. In addition to such a method, the electromagnetic radiation blocking layer 131 may be implemented by a plating process to have a form of a porous plating layer. As in the present exemplary embodiment, the electromagnetic radiation blocking layer 131 may be formed in the porous structure to significantly suppress a decrease in blocking efficiency of the electromagnetic radiations emitted from the semiconductor chip 120, and the like, and provide an effective gas discharge path, resulting in improvement of stability of the fan-out semiconductor package 100 at the time of driving the fan-out semiconductor package 100.

The passivation layer 150 may protect the connection member 140 from external physical or chemical damage. The passivation layer 150 may have openings exposing at least portions of the redistribution layer 142 of the connection member 140. The number of openings formed in the passivation layer 150 may be several tens to several thousands. The passivation layer 150 may include an insulating resin and an inorganic filler, but may not include a glass fiber. For example, the passivation layer 150 may be formed of ABF, but is not limited thereto.

The underbump metal layers 160 may improve connection reliability of the electrical connection structures 170 to improve board level reliability of the fan-out semiconductor package 100. The underbump metal layers 160 may be connected to the redistribution layer 142 of the connection member 140 exposed through the openings of the passivation layer 150. The underbump metal layers 160 may be formed in the openings of the passivation layer 150 by any known metallization method using any known conductive material such as a metal, but are not limited thereto.

The electrical connection structures 170 may be additionally configured to physically or electrically externally connect the fan-out semiconductor package 100. For example, the fan-out semiconductor package 100 may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 120P, or may be provided in an amount of several tens to several thousands or more or several tens to several thousands or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The passivation layer 180 may be disposed on the electromagnetic radiation blocking layer 131 and protect the electromagnetic radiation blocking layer 131 from external physical or chemical damage. The passivation layer 180 may include an insulating resin and an inorganic filler, but may not include a glass fiber. For example, the passivation layer 180 may be formed of ABF, but is not limited thereto.

Figure 12:
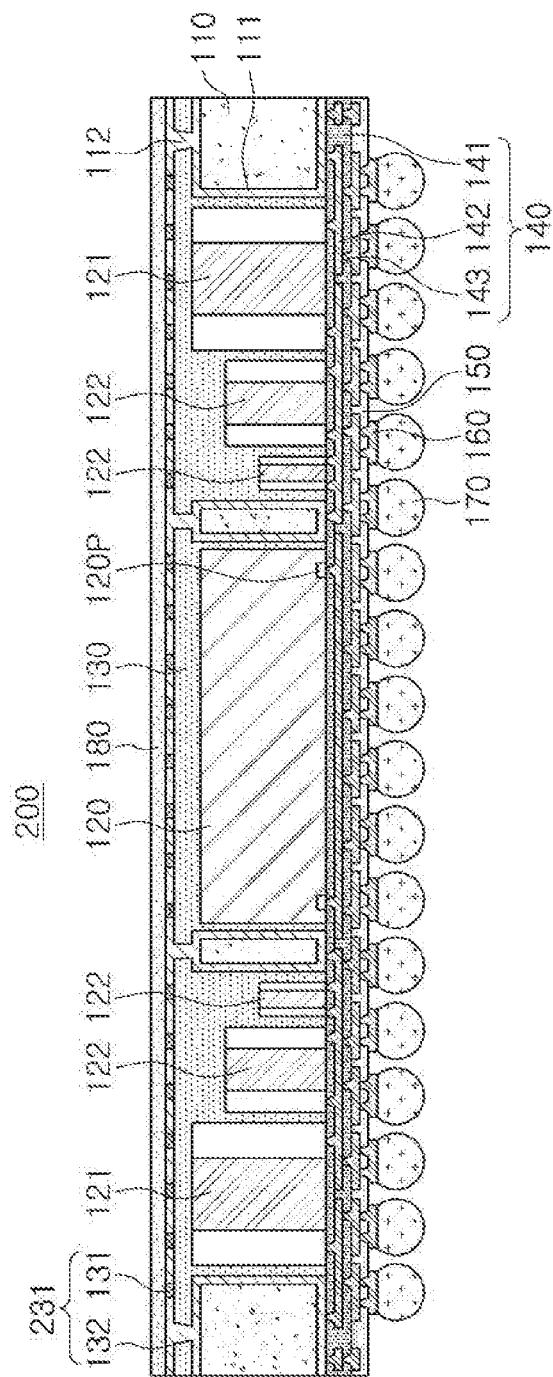
FIG. 12 is a cross-sectional view illustrating a fan-out semiconductor package according to another exemplary embodiment in the present disclosure.
Figure 13:
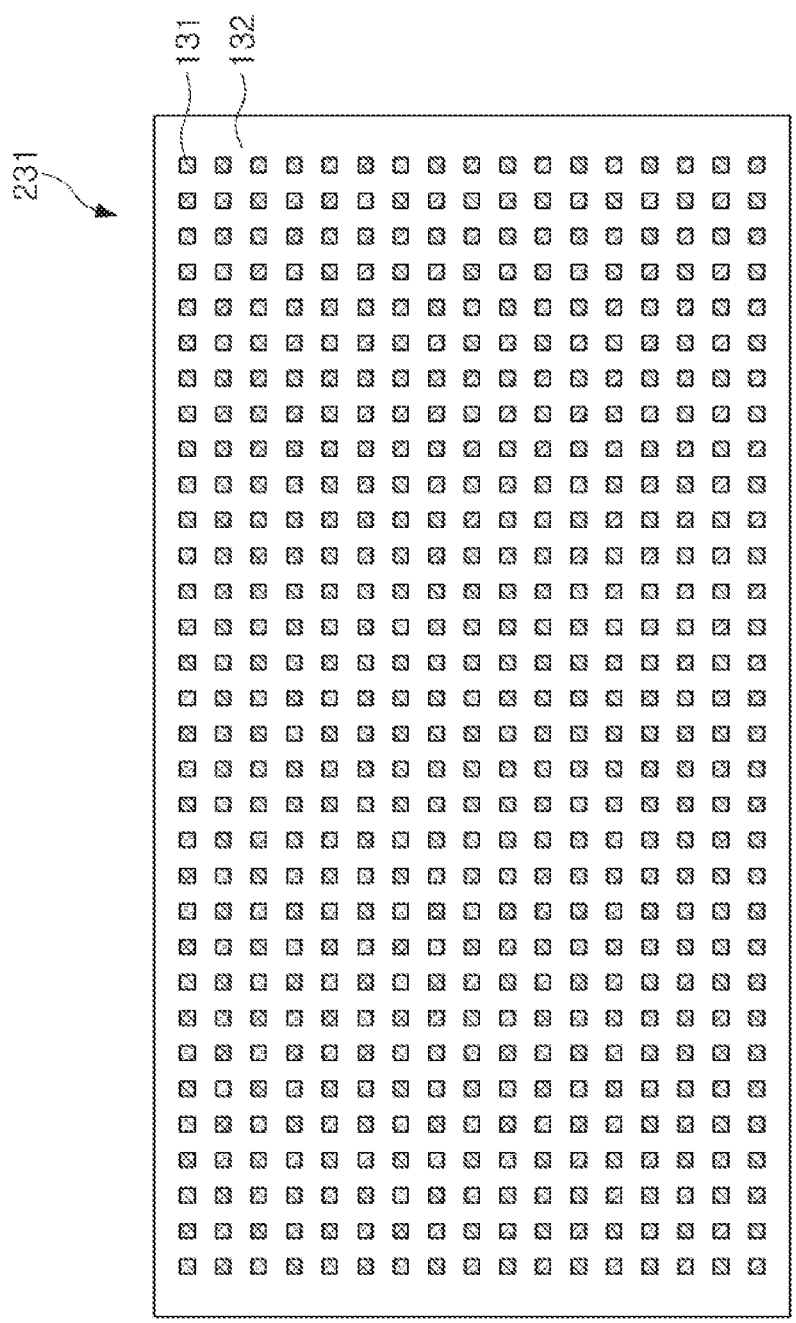
FIGS. 13 and 14 are views illustrating a form of an electromagnetic radiation blocking layer that may be used in another exemplary embodiment of FIG. 12.
Figure 14:
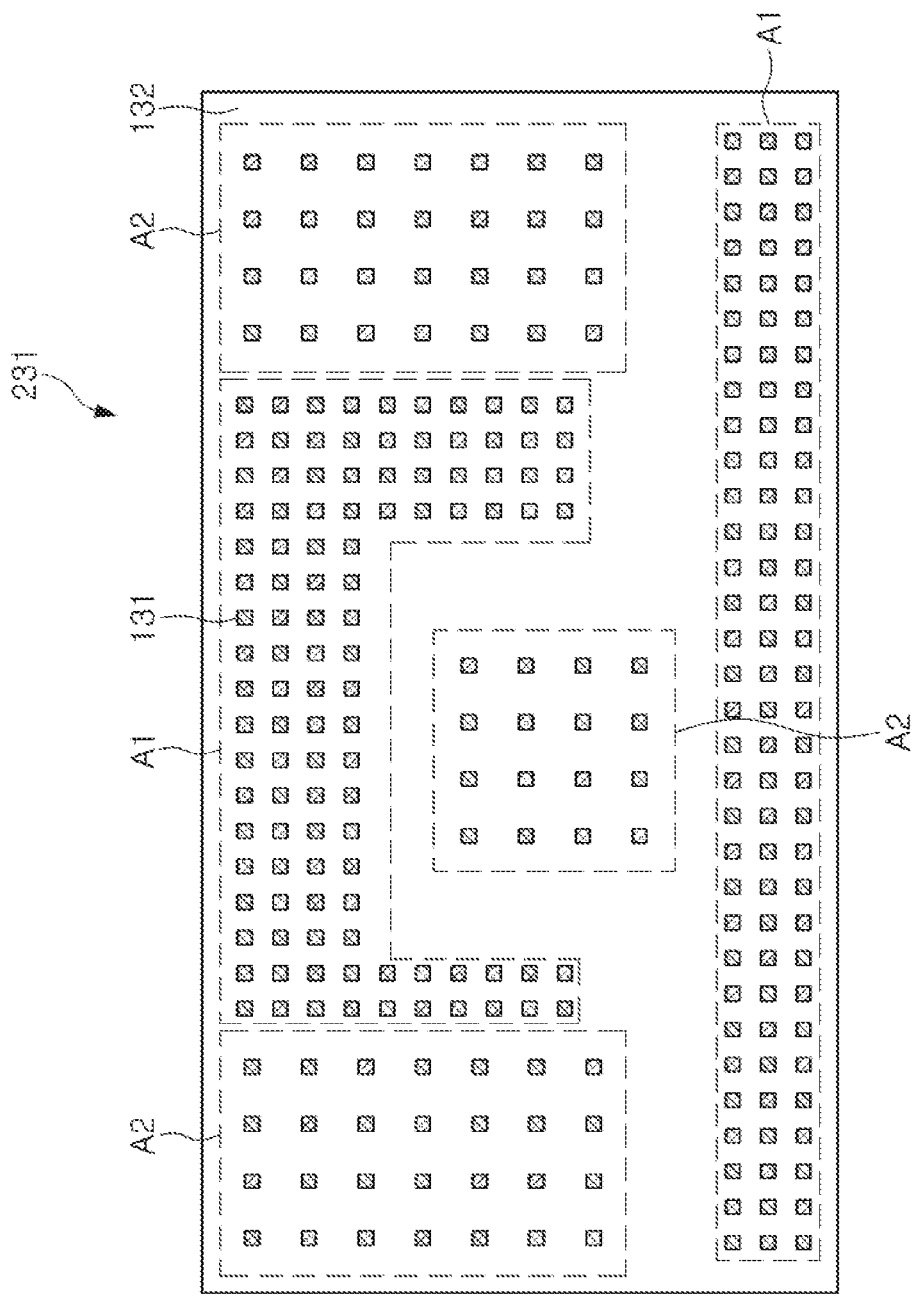

FIG. 12 is a cross-sectional view illustrating a fan-out semiconductor package according to another exemplary embodiment in the present disclosure. FIGS. 13 and 14 are views illustrating a form of an electromagnetic radiation blocking layer that may be used in another exemplary embodiment of FIG. 12. In the present exemplary embodiment, a fan-out semiconductor package 200 may include a semiconductor chip 120, an encapsulant 130, a connection member 140, and an electromagnetic radiation blocking layer 231. The electromagnetic radiation blocking layer 231 may include abase layer 132 and a porous blocking portion 131. In addition, the fan-out semiconductor package 200 may include a core member 110, additional passive components 121 and 122, passivation layers 150 and 180, underbump metal layers 160, electrical connection structures 170, and the like. Since the fan-out semiconductor package 200 is different in a form of the electromagnetic radiation blocking layer 231 from the fan-out semiconductor package 100 according to the exemplary embodiment described above, the electromagnetic radiation blocking layer 231 will be mainly described, and an overlapping description for other components will be omitted.

The electromagnetic radiation blocking layer 231 may include the base layer 132. A plurality of degassing holes may be formed in the base layer 132. In addition, the degassing holes of the base layer 132 may be filled with the porous blocking portion 131. The porous blocking portion 131 may have a porous structure in order to effectively discharge a gas as in the electromagnetic radiation blocking layer having the porous structure described in the above-mentioned exemplary embodiment. In detail, the porous blocking portion 131 may be implemented in a form in which a plurality of particles are agglomerated, a form of a porous plating layer, or the like. The base layer 132 may have metal thin film form that does not have a porous structure, may be, for example, a Cu plating layer, and may not provide a gas discharge path, but may be advantageous for blocking an electromagnetic radiation. Therefore, electromagnetic radiation blocking efficiency may be improved as compared to the abovementioned exemplary embodiment in which the entire electromagnetic radiation blocking layer 131 has the porous structure, and the electromagnetic radiation blocking layer 231 may be used in a case in which the electromagnetic radiation blocking efficiency is more important than gas discharge efficiency. The degassing holes of the base layer 132 may be implemented by a physical method, an etching method, a pattern plating method, or the like.

As in a form illustrated in FIG. 14, the electromagnetic radiation blocking layer 231 may include a first region A1 and a second region A2 in which densities of the degassing holes are different from each other. In this case, the density of the degassing holes may be higher in the first region A1 than in the second region A2. Here, the degassing holes of the electromagnetic radiation blocking layer 231 may be in a state in which they are filled with the porous blocking portion 131. In a region in which the necessity to block the electromagnetic radiation is great, a density of the degassing holes may be decreased or the degassing holes may not be formed. Similarly, in a region in which the necessity to block the electromagnetic radiation is not great or gas discharge efficiency needs to be increased, densities of the degassing holes may be designed to be different from each other in each region of the electromagnetic radiation blocking layer 231 in order to increase a density of the degassing holes.

The density of the degassing holes may refer to an area occupied by the degassing holes per unit area in the electromagnetic radiation blocking layer 231. For example, when sizes of the degassing holes in the first and second regions A1 and A2 are the same as each other, the number of degassing holes per unit area in the first region A1 may be more than that in the second region A2. In addition, in the present exemplary embodiment, the degassing holes may be finely formed to significantly suppress a decrease in the electromagnetic radiation blocking efficiency. The second region A2 in which the density of the degassing holes is relatively low in the electromagnetic radiation blocking layer 231 may be disposed in a region corresponding to the semiconductor chip 120, and such a region may be confirmed from the plan view of FIG. 10. In other words, as in the form illustrated in FIG. 14, in consideration of the fact that a relatively large amount of electromagnetic radiation is emitted from the semiconductor chip 120, the second region A2 in which the density of the degassing holes is low may be disposed to correspond to the semiconductor chip 120. In addition, in consideration of the fact that the necessity to block the electromagnetic radiation is relatively low in the passive components 121 and 122, a plurality of degassing holes may be disposed in the vicinity of the passive components 121 and 122 to improve gas discharge efficiency. In detail, the first region A1 of the electromagnetic radiation blocking layer 231 may be disposed in a region corresponding to at least some of a plurality of passive components 121 and 122. In this case, the density of the degassing holes in the corresponding region of the electromagnetic radiation blocking layer 231 may be controlled depending on a size, a kind, or the like, of passive components 121 and 122.

In detail, as in a form illustrated in FIG. 12, distances from upper surfaces of at least some of the plurality of passive components 121 and 122 to an upper surface of the encapsulant 130 may be different from each other, and a density of the degassing holes may be higher in a region corresponding to the passive component 122 having a larger distance from an upper surface thereof to the upper surface of the encapsulant 130. In other words, the first region A1 may be disposed in a region corresponding to the passive component 122 having a relatively smaller size, and the second region A2 may be disposed in a region corresponding to the passive component 121 having a relatively larger size. In the region corresponding to the passive component 122 having the relatively smaller size, a thickness of the encapsulant 130 may be larger, such that an amount of the discharged gas may be large. Therefore, in the region corresponding to the passive component 122 having the relatively smaller size, a higher number of degassing holes may be formed. On the other hand, in the region corresponding to the passive component 121 having the relatively larger size, a smaller number of degassing holes may be formed.

In addition, as described above, the plurality of passive components 121 and 122 may include the inductor 121, the capacitor 122, and the like, and a density of the degassing holes may be higher in a region corresponding to the capacitor 122 than in a region corresponding to the inductor 121. In other words, the first region A1 may correspond to the capacitor 122, and the second region A2 may correspond to the inductor 121. In the region corresponding to the inductor 121 emitting a relatively larger amount of electromagnetic radiation, the density of the degassing holes may be decreased, such that electromagnetic radiation blocking efficiency may not be decreased. A case in which the inductor 121 has the size larger than that of the capacitor 122 is illustrated in the present exemplary embodiment, but the inductor 121 is not necessarily larger than the capacitor 122. In addition, a structure in which the degassing holes are present in the second region A2 and are filled with the porous blocking portion 121 is illustrated in the present exemplary embodiment, but the degassing holes may not be present in the second region A2 in order to further improve the electromagnetic radiation blocking efficiency.

As set forth above, according to an exemplary embodiment in the present disclosure, a fan-out semiconductor package in which electromagnetic radiation blocking efficiency may be high and a gas that may be generated in a product may be effectively removed may be implemented.

While exemplary embodiments have been shown and described above, it will be apparent to those skilled in the art that modifications and variations could be made without departing from the scope of the present invention as defined by the appended claims.

What is claimed is:
1. A fan-out semiconductor package comprising:
  a connection member including an insulating layer and a redistribution layer;
  a semiconductor chip disposed on the connection member;
  an encapsulant encapsulating the semiconductor chip; and
  an electromagnetic radiation blocking layer disposed above the semiconductor chip and including a base layer in which a plurality of degassing holes are formed and a porous blocking portion filled in the plurality of degassing holes.
2. The fan-out semiconductor package of claim 1, wherein the porous blocking portion has a form in which a plurality of particles are agglomerated.

3. The fan-out semiconductor package of claim 1, wherein the porous blocking portion is a porous plating layer.

4. The fan-out semiconductor package of claim 1, wherein the base layer comprises metal thin film.

5. The fan-out semiconductor package of claim 1, wherein the base layer comprises a Cu plating layer.

6. The fan-out semiconductor package of claim 1, wherein the electromagnetic radiation blocking layer includes a first region and a second region, and a density of the degassing holes is higher in the first region than in the second region.

7. The fan-out semiconductor package of claim 6, wherein the second region is disposed in a region corresponding to the semiconductor chip.

8. The fan-out semiconductor package of claim 6, further comprising a core member including a through-hole in which the semiconductor chip is accommodated and a metal layer covering walls forming the through-hole.

9. The fan-out semiconductor package of claim 8, wherein the metal layer of the core member and the electromagnetic radiation blocking layer are connected to each other by a conductive via penetrating through the encapsulant.

10. The fan-out semiconductor package of claim 6, further comprising a plurality of passive components disposed on the connection member.

11. The fan-out semiconductor package of claim 10, wherein the first region is disposed in a region corresponding to at least some of the plurality of passive components.

12. The fan-out semiconductor package of claim 11, wherein distances from upper surfaces of at least some of the plurality of passive components to an upper surface of the encapsulant are different from each other, and a density of the degassing holes is higher in a region corresponding to a passive component having a larger distance from an upper surface thereof to the upper surface of the encapsulant among the plurality of passive components, the upper surfaces being surfaces of corresponding components and encapsulant away from the connection member.

13. The fan-out semiconductor package of claim 10, wherein the plurality of passive components include a capacitor and an inductor, and a density of the degassing holes is higher in a region corresponding to the capacitor than in a region corresponding to the inductor.

14. A fan-out semiconductor package comprising:
a connection member including an insulating layer and a redistribution layer;
a semiconductor chip disposed on the connection member;
an encapsulant encapsulating the semiconductor chip; and
an electromagnetic radiation blocking layer disposed above the semiconductor chip and having a porous structure.

15. The fan-out semiconductor package of claim 14, wherein the electromagnetic radiation blocking layer has a form in which a plurality of particles are agglomerated.

16. The fan-out semiconductor package of claim 14, wherein the electromagnetic radiation blocking layer is a porous plating layer.

* * * * *